United States Patent

Hwang et al.

[11] Patent Number: 6,162,675
[45] Date of Patent: Dec. 19, 2000

[54] METHOD OF PREVENTING MISALIGNMENT OF SELECTIVE SILICIDE LAYER IN THE MANUFACTURE OF A DRAM DEVICE AND THE DRAM DEVICE FORMED THEREBY

[75] Inventors: Tae-Byung Hwang, Suwon; Duck-Hyung Lee, Yongin, both of Rep. of Korea

[73] Assignee: Samsung Electronics Co., Ltd., Kyungki-do, Rep. of Korea

[21] Appl. No.: 09/497,405

[22] Filed: Feb. 3, 2000

[30] Foreign Application Priority Data

Apr. 22, 1999 [KR] Rep. of Korea ...................... 99-14420

[51] Int. Cl.[7] ...................... H01L 21/8242; H01L 21/336
[52] U.S. Cl. .......................... 438/241; 438/258; 438/279; 438/299; 438/592; 438/453; 257/365; 257/412
[58] Field of Search ....................................... 257/365, 412, 257/384, 900, 908; 438/453, 241, 258, 275, 279, 299, 592

[56] References Cited

U.S. PATENT DOCUMENTS 6,015,748 1/2000 Kim et al. .............................. 438/592

*Primary Examiner*—Charles Bowers
*Assistant Examiner*—Erik Kielin
*Attorney, Agent, or Firm*—Eugene M. Lee

[57] ABSTRACT

A semiconductor device and a method of making the semiconductor device are disclosed. The semiconductor device includes a substrate having at least one gate electrode, the gate electrode having lateral walls and edges. Spacers are formed on the lateral walls of the gate electrode, and active areas are formed inside the substrate at the edges of the gate electrode. A DRAM cell forming part is disposed on a portion of the substrate, and includes at least one gate electrode and an active area, and a logic forming part is disposed on another portion of the substrate, and includes at least one gate electrode and an active area. The device further includes a silicide blocking layer disposed at the active area of the DRAM cell forming part, and a silicide layer formed on at least one gate electrode of the DRAM cell forming part, and on a gate electrode and the active area of the logic forming part. The method is simplified and provides selective silicidation of a highly integrated DRAM and an embedded DRAM where the DRAM cell forming part and the logic forming part are merged.

24 Claims, 10 Drawing Sheets

METHOD OF PREVENTING MISALIGNMENT OF SELECTIVE SILICIDE LAYER IN THE MANUFACTURE OF A DRAM DEVICE AND THE DRAM DEVICE FORMED THEREBY

BACKGROUND OF THE INVENTION

1. Field of the Invention

The present invention relates to a semiconductor device and to a method of making the same. More specifically, the invention relates to a semiconductor device and to a method of making the semiconductor device whereby the method eliminates process defects in the device that can be caused by misalignment that occurs during the course of forming a selective silicide layer of a highly integrated dynamic random access memory (DRAM) or an embedded DRAM, where the DRAM cell forming part and the logic forming part are merged. The present invention therefore provides an improved semiconductor device and simplifies the method of making the device.

2. Description of Related Art

While semiconductor devices are becoming more highly integrated, their contact size is becoming smaller and smaller. This causes a problem because the contact resistance of the semiconductor device becomes larger. To prevent this problem, a salicide (self-aligned silicide) process has been developed, which has been applied to produce a logic device as small as about 0.35 μm. The DRAM of a capacitor on a bit line (COB), however, requires a heat cycle treatment after the salicide process. In addition, the DRAM of a COB requires an extremely low junction leakage at the memory cell region thereof. Thus, the salicide process has not been applied to a DRAM due to the relatively weak junction leakage.

A representative example of a low resistance metal commonly used in the salicide process is W-polycide. There is a gate resistance-related problem, however, that limits applying W-polycide to the giga-bit level of the DRAM in which the wire width of a cell gate typically is smaller than 0.2 μm, or to the DRAM embedded with a high density gate logic. At present, if a selective silicide layer needs to be formed, there is a tendency to use low resistance metals such as TiSi or CoSi, or the like.

If a semiconductor device is manufactured by using the salicide process, there may be no problem if a silicide layer is formed over the entire semiconductor device, but there may be a problem if a selective silicide layer needs to be formed in a particular portion of the device. Such a selective silicide layer may need to be formed due to problems in characteristics of the device, and a separate photo etching process may be needed to leave a silicide blocking layer (SBL) at a particular portion of the device. Forming the selective silicide layer in this manner makes the process procedure complicated and difficult.

In this process, a portion of the formed silicide layer should be opened or etched to have a different step coverage of a gate. Thus, there can be difficulties because a critical level of the photo etching process is required in etching the SBL. To take into consideration misalignment that may occur during the course of the photo etching process, margins should be secured at the portion of the formed silicide layer and at both sides of the SBL. Accordingly, there is a lot of active research to make progress in solving these difficulties.

FIGS. 1 through 7 are diagrams illustrating process sequences for forming a selective silicide layer of a conventional semiconductor device in accordance with previously known techniques. With reference to the drawings, the fabricating method of the semiconductor device can be classified into 7 processes, which will be described in more detail below. For example, when fabricating a semiconductor device having a merged DRAM cell forming part and a logic forming part, the processes of forming a silicide layer at a gate electrode and an active area of the logic forming part and a gate electrode of the DRAM cell forming part will be described even though the silicide layer is not formed at the active area of the DRAM cell forming part (particularly, a storage node forming part). Symbols A and B in the drawings represent the DRAM cell forming part and the logic forming part, respectively, of the semiconductor device.

FIG. 1 illustrates a first portion of the process whereby a polysilicon gate electrode 14 is formed on a silicon substrate 10 having gate insulating layers (not shown) and field oxide layers 12, which are used as a mask to ion implant a low concentration of impurities into the substrate 10 to form a lightly doped drain LDD (not shown). Then, a spacer 16 made of a nitride or oxide layer is formed at both lateral walls of the gate electrode 14, and a high concentration of impurities are ion implanted into the substrate to thereby form an active area (not shown), which serves as a source and a drain inside the substrate 10, and is disposed at both edges of the gate electrode 14.

FIG. 2 illustrates forming an insulating layer 18 made of an oxide layer over the entire resultant structure.

FIG. 3 shows a process of coating an anti-reflective layer 20 (hereinafter referred to as ARL) over the insulating layer 18. The ARL 20 is coated over the insulating layer 18 because ultraviolet (UV) rays may diffuse reflectively on the surface of the insulating layer 18 during the course of the photolithographic process that is performed later on during the process. Therefore, without the ARL 20, it may be difficult to obtain a targeted fine pattern SBL of the insulating layer 18 during the later photolithographic process.

As shown in FIG. 4, a photoresist layer 22 is formed on the ARL 20. Then, A predetermined portion of the silicide layer forming part (for example, the upper portion of the gate electrode 14 of the DRAM cell forming part and the upper portion of the gate electrode and the active area of the logic forming part B) will be selectively etched to expose the surface of the ARL 20.

As shown in FIG. 5, the photo-etched photoresist layer 22 is used as a mask to sequentially etch the ARL 20 and the insulating layer, thereby forming a SBL 18a made of an insulating layer 18 under the etched ARL 20. As a result, the surface of the gate electrode 14 of the DRAM cell forming part A and the surface of the gate electrode 14 and the surface of the active area of the logic forming part B are exposed.

FIG. 6 illustrates a process a removing the ARL 20 by a wet cleaning process using an etchant such as hydrofluoric acid (HF), or the like (e.g., etchants of the HF class). As described above, the ARL 20 is removed before formation of the silicide layer. If the silicide layer is formed with the ARL remaining, there will be a lifting phenomenon during the subsequent heat treatment cycle caused by weak, defective adhesion between the ARL and a subsequently deposited metal having a high melting point.

As shown in FIG. 7, a metal having a high melting point, such as Co, Ti, or Ni, is deposited over the entire substrate 10 including the gate electrode 14, the spacer and the SBL 18a, to which a heat treatment cycle then is applied. At this time, at the region where the SBL 18a is removed, silicon and the metal having a high melting point are reacted to form a low resistance metal that makes up the silicide layer 24. On the other hand, at the region where the SBL 18a remains, or where the lateral wall spacer 16 is formed, the silicon and the metal having a high melting point are not reacted together, thereby leaving the metal having a high melting point as a non-reacted metal. Then, the non-reacted metal having a high melting point can be removed to complete the fabricating procedure.

In the process of forming the selective silicide layer of the semiconductor device thus described, there may be several problems as follow:

Firstly, during the etching process to leave a predetermined portion of the SBL 18a, the ARL deposition process is required, and a critical level of photo etching is required. This results in a complicated fabricating operation and an increase in fabricating cost.

Secondly, even if there is no problem at the region over which the silicide layer is formed over the whole surface, as in the logic forming part B, there may be a problem at the region where the silicide layer is selectively formed on the surface of the gate electrode 14, as in the DRAM cell forming part A. This problem results in misalignment and local formation of the silicide layer at the gate electrode 14 or at the source and drain portion of the active area. As these problems worsen due to a decrease in the size of the fine pattern with the increasing tendency of the high integration of DRAM cells, it is urgent that some measures be taken to solve them.

Thirdly, in the course of removing the ARL, a portion of the SBL 18a may be etched together due to a defective etching selection ratio. In the worst case, the SBL 18a cannot perform its original function, thereby causing a defect that the silicide layer may be formed at regions where it should not be formed.

SUMMARY OF THE INVENTION

In order to solve the aforementioned problems, it is a feature of the present invention to provide a semiconductor device having a design such that active area of the logic forming part is larger when compared to the active area of the DRAM cell forming part. In the semiconductor device, a selective silicide layer can be formed without the need for an ARL deposition process, and without the need to provide a critical level of photo etching to leave a predetermined portion of the SBL, thereby eliminating process defects caused by misalignment. The method of making the semiconductor device also is simplified in accordance with the invention.

It is another feature of the present invention to provide a semiconductor device designed so that the active area of the DRAM cell forming part is constructed with the same size as the active area of the logic forming part. In such a semiconductor device, a selective silicide layer can be formed without an ARL deposition process, and without the need to provide a critical level of photo etching to leave a predetermined portion of the SBL, thereby eliminating process defects caused by misalignment. The method of making the semiconductor device also is simplified in accordance with the invention.

It is an additional feature of the present invention to provide an effective and efficient method of making the aforementioned semiconductor devices.

In an effort to satisfy these and other features of the present invention, there is provided a semiconductor device including:

a substrate having at least one gate electrode, the gate electrode having lateral walls and edges;

spacers formed on the lateral walls of the gate electrode;

active areas formed inside the substrate at the edges of the gate electrode;

a DRAM cell forming part disposed on a portion of the substrate and including at least one gate electrode and an active area;

a logic forming part disposed on another portion of the substrate and including at least one gate electrode and an active area;

a silicide blocking layer disposed at the active area of the DRAM cell forming part; and a silicide layer formed on at least one gate electrode of the DRAM cell forming part, on a gate electrode and on the active area of the logic forming part.

In accordance with another feature of the invention, there is provided a semiconductor device comprising:

a substrate having at least one gate electrode, the gate electrode having lateral walls and edges;

a DRAM cell forming part disposed on a portion of the substrate and comprising at least one gate electrode and an active area;

a logic forming part disposed on another portion of the substrate, the logic forming part comprising at least one gate electrode and an active area;

spacers formed on the lateral walls of the gate electrode, the spacers having a dual layer structure in the DRAM cell forming part, and having a single layer structure in the logic forming part;

an active area formed inside the substrate at the edges of the gate electrode;

a silicide blocking layer disposed at the active area of the DRAM cell forming part; and a silicide layer formed on at least one gate electrode of the DRAM cell forming part, on at least one gate electrode and on the active area of the logic forming part.

In accordance with another feature of the invention, there is provided a method of making a semiconductor device comprising:

providing a substrate having a DRAM cell forming part and a logic forming part;

forming at least one gate electrode having lateral walls and edges on the substrate;

forming spacers on the lateral walls of the gate electrode;

forming active areas in the substrate at the edges of the gate electrode in both the DRAM cell forming part and in the logic forming part;

forming an insulating layer on the entire surface of the substrate including the gate electrode and the spacers;

etching the insulating layer by more than the thickness of the insulating layer that is disposed above the at least one gate electrode so that portions of the insulating layer remain in self-alignment at active areas disposed between gate electrodes of the DRAM forming part; and forming a silicide layer on the gate electrode of the DRAM cell forming part, and on the gate electrode and the active area of the logic forming part.

In accordance with yet another feature of the invention, there is provided a method of making a semiconductor device comprising: providing a substrate having a DRAM cell forming part and a logic forming part;

forming at least one gate electrode having lateral walls and edges on the substrate;

forming spacers on the lateral walls of the gate electrode;

forming at least one active area inside the substrate at the edges of the at least one gate electrode;

forming an etch stopper layer over the entire surface of the substrate including the gate electrode and the spacers;

forming an insulating layer on the etch stopper layer;

etching the insulating layer until the etch stopper layer of the gate electrode is exposed so that portions of the insulating layer remain in self-alignment at the active area disposed between gate electrodes of the DRAM cell forming part;

eliminating the etch stopper layer disposed at the portions where the insulating layer was removed to thereby expose the gate electrode of the DRAM cell forming part and the gate electrode and the active area of the logic forming part; and forming a silicide layer on the gate electrode of the DRAM cell forming part and on the gate electrode and the active area of the logic forming part.

In accordance with another feature of the invention, there is provided a method of making a semiconductor device comprising: providing a substrate having a DRAM cell forming part and a logic forming part;

forming at least one gate electrode on the substrate, the gate electrode having lateral walls and edges;

forming spacers at the lateral walls of the gate electrode, the spacers comprising a dual layer construction having a first layer disposed adjacent the lateral walls of the gate electrode, and a second layer disposed on the first layer and external to the lateral walls;

forming a photoresist layer pattern at the DRAM cell forming part and ion implanting a high concentration of impurities into the resultant structure to form an active area;

etching the spacers using the photoresist layer pattern as a mask to eliminate the second layer disposed external to the lateral walls of the gate electrode to produce a single layer structure of the spacers in the logic forming part;

removing the photoresist layer pattern;

forming a silicide blocking layer on the resultant structure;

forming an insulating layer on the silicide blocking layer;

etching the silicide blocking layer until the silicide blocking layer disposed on the gate electrode is exposed so that portions of the insulating layer remain in self-alignment at an active area disposed between the gate electrodes of the DRAM cell forming part;

etching the silicide blocking layer of the region where portions of the insulating layer do not remain to expose the gate electrode of the DRAM cell forming part and the gate electrode and active area of the logic forming part; and forming silicide layers on the gate electrode of the DRAM cell forming part, and on the gate electrode and the active area of the logic forming part.

These and other features of the invention will be readily apparent to those skilled in the art upon review of the detailed description that follows.

DETAILED DESCRIPTION OF PREFERRED EMBODIMENTS

Figure 1:
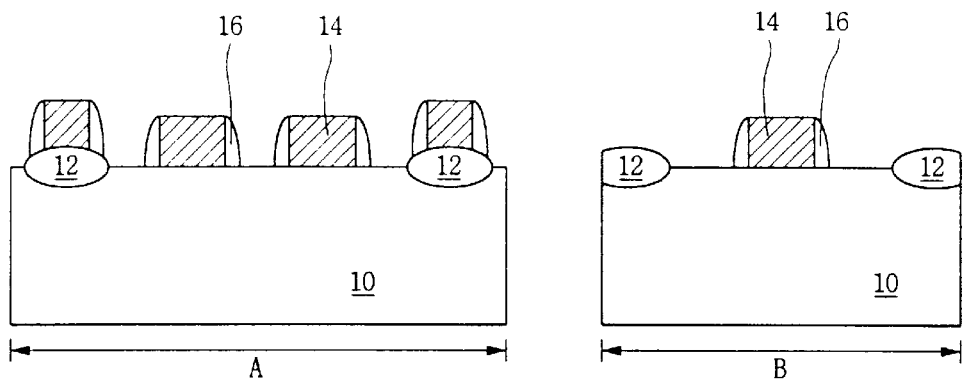
FIGS. 1 through 7 illustrate a process sequence for fabricating a selective silicide layer of a conventional semiconductor device.
Figure 2:
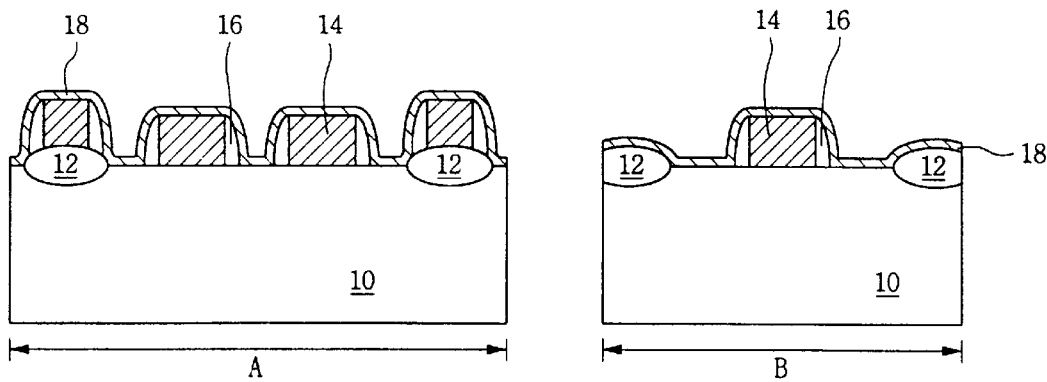
Figure 3:
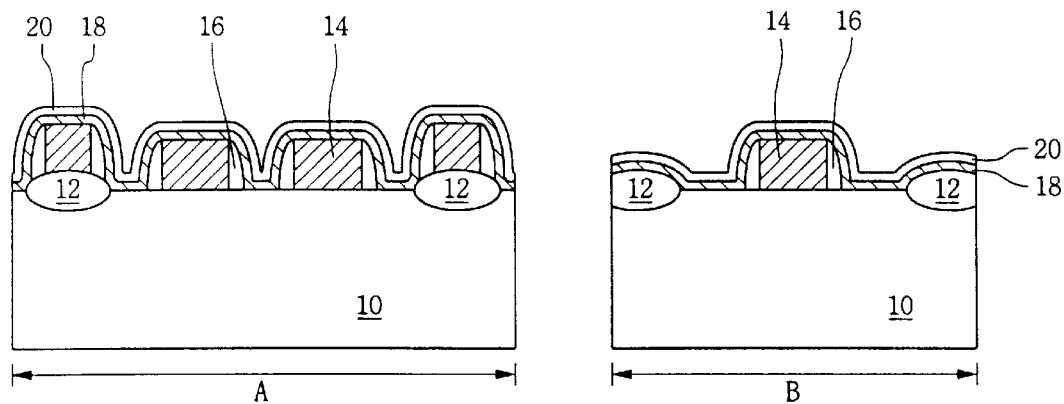
Figure 4:
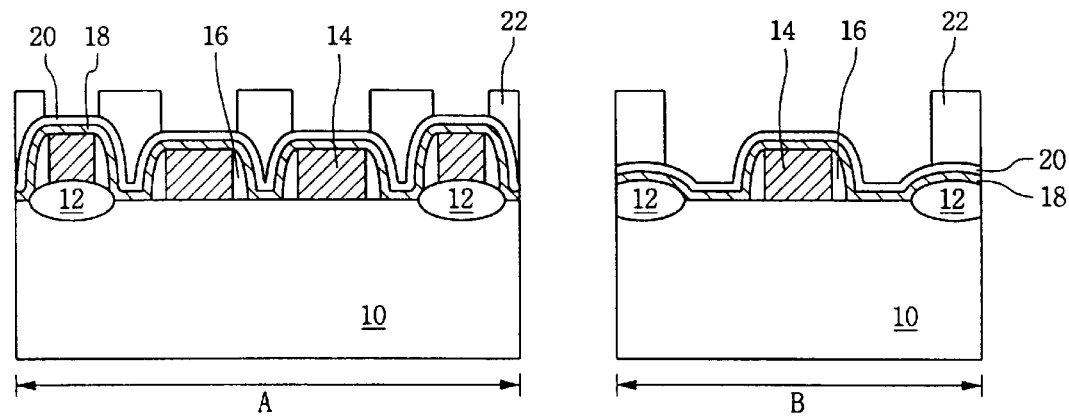
Figure 5:
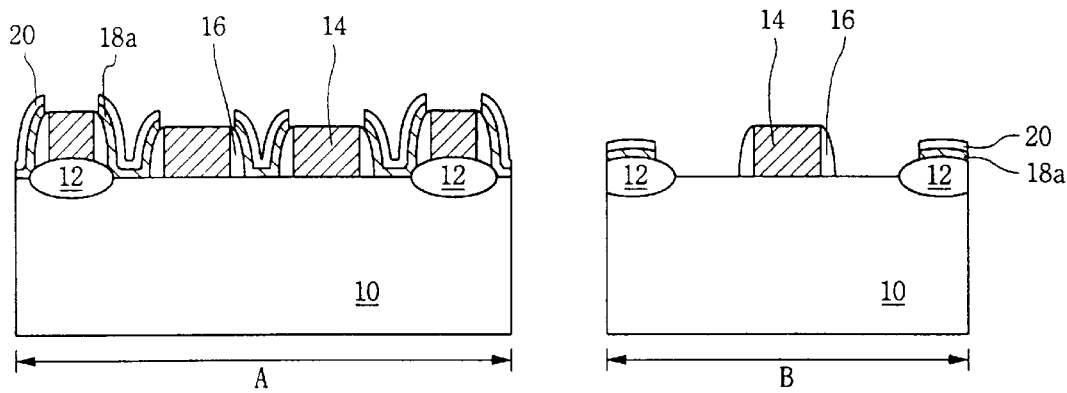
Figure 6:
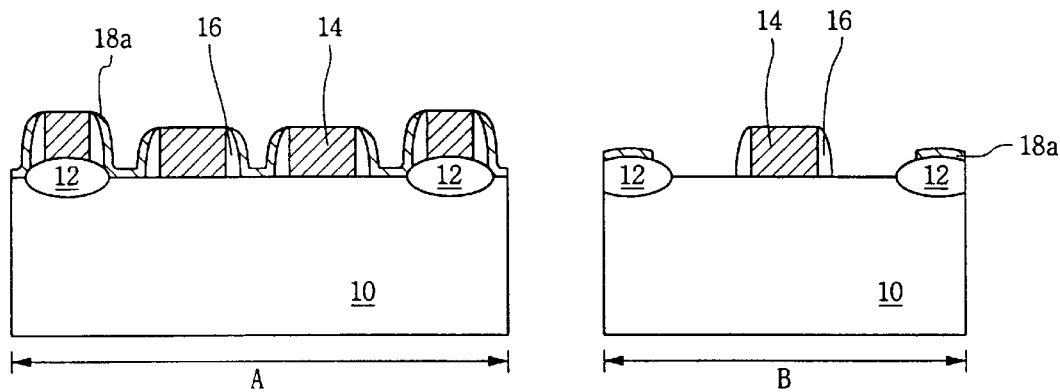
Figure 7:
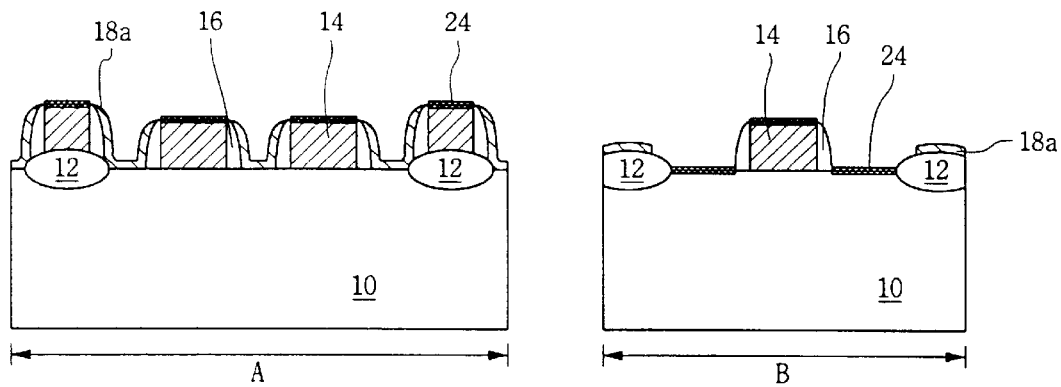

Korean patent application number 99-14420, filed on Apr. 22, 1999 and entitled: "Semiconductor Device and Fabricating Method Thereof," is incorporated by reference herein in its entirety.

Preferred embodiments of the present invention will be described in detail with reference to accompanying drawings.

The present invention relates to a semiconductor device including a substrate having at least one gate electrode, the gate electrode having lateral walls and edges. Spacers are formed on the lateral walls of the gate electrode, and active areas are formed inside the substrate at the edges of the gate electrode. A DRAM cell forming part is disposed on a portion of the substrate, and includes at least one gate electrode and an active area, and a logic forming part is disposed on another portion of the substrate, and includes at least one gate electrode and an active area. The device further includes a silicide blocking layer disposed at the active area of the DRAM cell forming part, and a silicide layer formed on at least one gate electrode of the DRAM cell forming part, and on a gate electrode and the active area of the logic forming part.

In this embodiment of the invention, the silicide blocking layer (SBL) preferably is: (i) a deposition layer structure that includes an etch stopper layer and an insulating layer; or (ii) a single layer structure including an insulating layer. The silicide blocking layer preferably has a step coverage that is smaller than the step coverage of the gate electrode. In this embodiment, the etch stopper layer preferably is made of a nitride layer or an undoped polysilicon layer, and the insulating layer preferably is made of either a single layer structure or more than one layer made of materials selected from undoped polysilicon glass (USG), a chemical vapor deposited (CVD) oxide layer(s), and mixtures thereof.

The invention also provides a semiconductor device that includes a substrate having at least one gate electrode, whereby the gate electrode has lateral walls and edges. The device also includes a DRAM cell forming part disposed on a portion of the substrate and comprises at least one gate electrode and an active area, and a logic forming part disposed on another portion of the substrate, the logic forming part comprising at least one gate electrode and an active area. Spacers can be formed on the lateral walls of the gate electrode, the spacers having a dual layer structure in the DRAM cell forming part, and having a single layer structure in the logic forming part. Active areas also can be formed inside the substrate at the edges of the gate electrode. The device further includes a silicide blocking layer disposed at the active area of the DRAM cell forming part, and a silicide layer formed on at least one gate electrode of the DRAM cell forming part, and on at least one gate electrode and on the active area of the logic forming part.

In this embodiment, the SBL preferably has a deposition layer structure including an insulating layer and a thermal oxide layer with a smaller step coverage than the insulating layer of the gate electrode, wherein the insulating layer is made of SiN or a SiON layer and the thermal oxide layer is made of a high temperature oxide layer (hereinafter referred to as HTO) or a medium temperature oxide layer (hereinafter referred to as MTO).

The present invention also provides a method of making a semiconductor device by first providing a substrate having a DRAM cell forming part and a logic forming part. A gate electrode having lateral walls and edges on the substrate is formed on the substrate and then spacers can be formed on the lateral walls of the gate electrode. Active areas in the substrate then can be formed at the edges of the gate electrode in both the DRAM cell forming part and in the logic forming part. An insulating layer then preferably is formed on the entire surface of the substrate including the gate electrode and the spacers, and then etched by more than the thickness of the insulating layer that is disposed above the at least one gate electrode so that portions of the insulating layer remain in self-alignment at active areas disposed between gate electrodes of the DRAM forming part. Finally, the method includes forming a silicide layer on the gate electrode of the DRAM cell forming part, and on the gate electrode and the active area of the logic forming part.

The invention also relates to a method of making a semiconductor device comprising first providing a substrate having a DRAM cell forming part and a logic forming part, and then forming at least one gate electrode having lateral walls and edges on the substrate. Spacers then can be formed on the lateral walls of the gate electrode, and at least one active area is formed inside the substrate at the edges of the at least one gate electrode. The method further includes forming an etch stopper layer over the entire surface of the substrate including the gate electrode and the spacers, forming an insulating layer on the etch stopper layer, and then etching the insulating layer until the etch stopper layer of the gate electrode is exposed so that portions of the insulating layer remain in self-alignment at active areas disposed between gate electrodes of the DRAM cell forming part. The method also encompasses eliminating the etch stopper layer disposed at the portions where the insulating layer was removed to thereby expose the gate electrode of the DRAM cell forming part and the gate electrode and the active area of the logic forming part, and forming a silicide layer on the gate electrode of the DRAM cell forming part and on the gate electrode and the active area of the logic forming part.

The present invention also relates to a method of making a semiconductor device by first providing a substrate having a DRAM cell forming part and a logic forming part, and forming at least one gate electrode on the substrate, the gate electrode having lateral walls and edges. Spacers then are formed at the lateral walls of the gate electrode, and the spacers preferably comprise a dual layer construction having a first layer disposed adjacent the lateral walls of the gate electrode, and a second layer disposed on the first layer and external to the lateral walls. The method includes forming a photoresist layer pattern at the DRAM cell forming part and ion implanting a high concentration of impurities into the resultant structure to form an active area, and then etching the spacers using the photoresist layer pattern as a mask to eliminate the second layer disposed external to the lateral walls of the gate electrode to produce a single layer structure of the spacers in the logic forming part. In the method, the photoresist layer pattern then is removed, and a silicide blocking layer is formed on the resultant structure. The method also includes forming an insulating layer on the silicide blocking layer, etching the silicide blocking layer until the silicide blocking layer disposed on the gate electrode is exposed so that portions of the insulating layer remain in self-alignment at the active area disposed between the gate electrodes of the DRAM cell forming part, and then etching the silicide blocking layer of the region where portions of the insulating layer do not remain to expose the gate electrode of the DRAM cell forming part and the gate electrode and active area of the logic forming part. Finally, the method includes forming silicide layers on the gate electrode of the DRAM cell forming part, and on the gate electrode and the active area of the logic forming part.

By making the semiconductor device in accordance with the present invention, one can avoid carrying out an antireflective layer (ARL) deposition process and a separate photo etching process to etch the insulating layer used as a SBL. The method of the invention therefor simplifies the fabricating operations. Thus, there are a number of advantages in the fabricating method of the present invention, including, inter alia, avoiding process defects caused by misalignment (for instance, defects that the silicide layer is not formed partially at the gate electrode of the DRAM cell forming part, and/or that the silicide layer is formed only partially at the source and drain portions of the active area) or caused in eliminating the ARL (for instance, a defect that a SBL forming part is etched together when eliminating the ARL).

The method of the invention is simplified because there is no need to apply the ARL deposition process, and there is no need to require the critical level of the photo etching process needed to leave a predetermined portion (for instance, the active area between gate electrodes of the DRAM cell forming part A) of an insulating layer used for the SBL. Because of this simplified process, a silicide layer can selectively be formed in self alignment at a desired portion without damaging refresh characteristic of the DRAM cells. This is an important feature of the present invention, which will be described with reference to FIGS. 8 through 13, and FIGS. 14 through 19.

FIGS. 8 through 13 illustrate a process sequence for fabricating a selective silicide layer of a semiconductor device in accordance with a preferred embodiment of the present invention. The semiconductor device of this embodiment preferably is manufactured so that the active area of the logic forming part is large in comparison to the active area of the DRAM cell forming part.

On the other hand, FIGS. 14 through 19 illustrate a process sequence for fabricating a selective silicide layer of a semiconductor device in accordance with another preferred embodiment of the present invention. The semiconductor device of this embodiment is manufactured so that the active area in the DRAM cell forming part is the of the same or similar size to the active area in the logic forming part.

Referring now to FIGS. 8 through 13, the semiconductor device having the DRAM cell forming part and the logic forming part merged together will be described as an example. In this embodiment, a silicide layer should be formed at the gate electrode and at the active area of the logic forming part, and a silicide layer should be formed at the gate electrode of the DRAM cell forming part, but should not be formed at the active area (particularly, storage node forming portion) of the DRAM cell forming part. Symbols A and B in the drawings denote a DRAM cell forming part and a logic forming part, respectively, of the semiconductor device.

Figure 8:
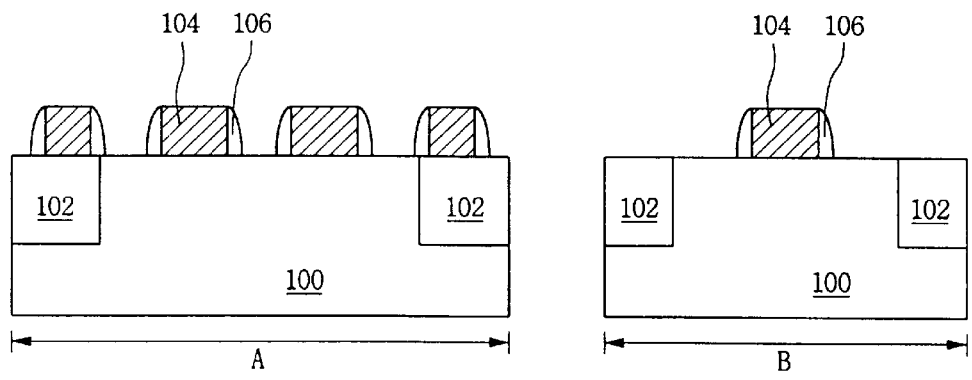
FIGS. 8 through 13 illustrate a process sequence for fabricating a selective silicide layer of a semiconductor device in accordance with an embodiment of the present invention.

FIG. 8 illustrates the formation of a shallow trench isolation (STI) 102 by applying a trench technique at a predetermined portion inside a semiconductor substrate 100 (e.g., silicon substrate). Skilled artisans are capable of applying a trench technique to form STI 102, using the guidelines provided herein. A gate insulating layer (not shown) can be formed over the entire substrate 100 including STI 102, and preferably has a thickness of from 30 to 200 Å. A polysilicon gate electrode 104 then can be formed on the gate insulating layer through an oxidation process. Those skilled in the art recognize that STI 102, which can be used for the device separation zone, can be replaced by a field oxide layer 12, as shown in FIG. 1.

The gate electrode 104 then can be used as a mask to ion implant a low concentration of impurities (e.g., impurity ions) into the substrate 100 to form a lightly doped drain (LDD; not shown). An insulating layer made of an oxide layer or nitride layer then preferably is formed over the substrate 100 including the gate electrode 104, to which an etch-back process is performed to form spacers 106 at the lateral walls of the gate electrode 104. Then, the gate electrode 104 and spacers 106 can be used as a mask to ion implant a high concentration of impurities (e.g., impurity ions) into the substrate 100 to thereby form an active area (not shown) for a source and a drain inside the substrate 100 at both edges of the gate electrode 104.

Figure 9:
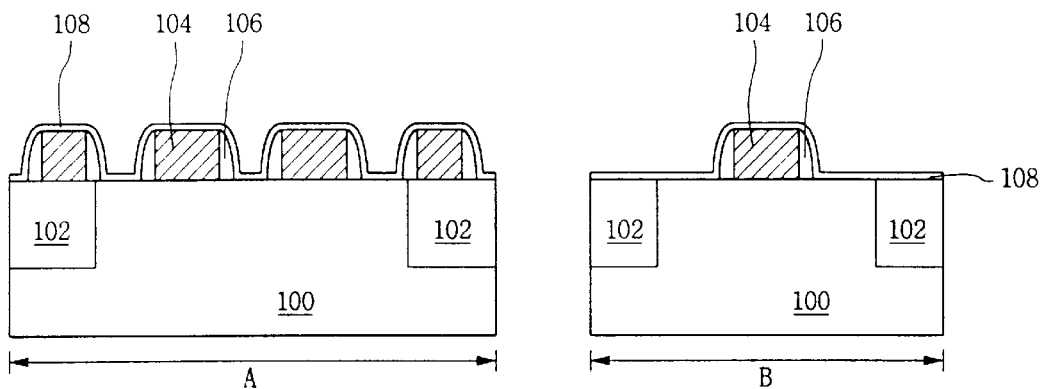

FIG. 9 illustrates forming an etch stopper layer 108 over the substrate 100 including the gate electrode 104 and spacers 106. Etch stopper layer 108 preferably is formed with a thickness of from 20 to 200 Å, and ultimately is used as a silicide blocking layer (SBL). The etch stopper layer 108 preferably is made of a nitride layer or an undoped polysilicon layer.

Figure 10:
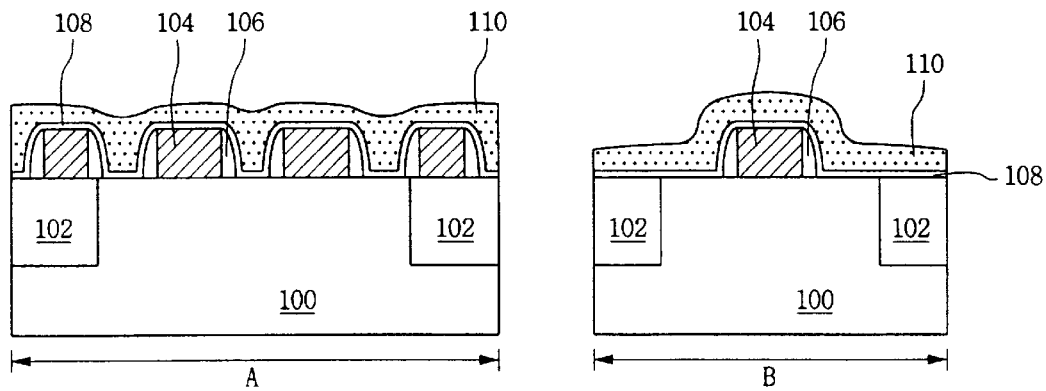

FIG. 10 illustrates forming an insulating layer 110 over the etch stopper layer 108 and filling up the active areas of the DRAM cells, which ultimately are used as the SBL. It is preferred that the insulating layer 110 be made of a single structure of undoped silicate glass (USG) or a chemical vapor deposition (CVD) oxide layer, or it may be a deposition structure comprising multiple layers of these layers. Those skilled in the art recognize that even though not shown in the drawings, the method of the invention may form a low pressure chemical vapor deposition (LPCVD) oxide layer for passivation before forming insulating layer 110.

Figure 11:
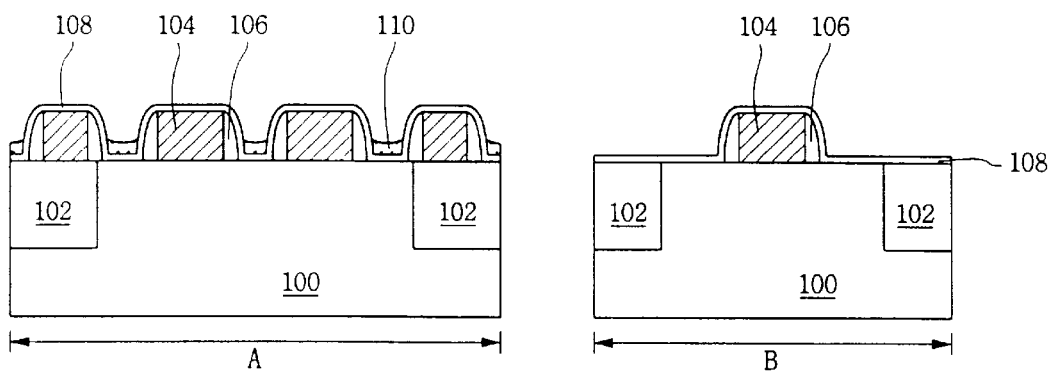

As shown in FIG. 11, insulating layer 110 is wet etched by using, for example, an etchant such as HF, and the like (e.g., an HF class of chemicals) until the surface of the etch stopper layer 108 on the gate electrode 104 is exposed. As a result, the insulating layer 110, which is used for the SBL, remains in self alignment, and has a thickness of more than hundreds of Angstroms at the active area disposed between gate electrodes 104 of the DRAM cell forming part A. Etching of the insulating layer 110 can be effected by any means known in the art for etching such layers, and preferably includes a dry etching process used for an etch-back process over the insulating layer 110, and then a wet etching process for etching the remaining portions of the layer.

As described above, the insulating layer 110 selectively remains only at the memory cell forming part A because the active area (source and drain zone) of the logic forming part B is wider than the active area of the DRAM cell forming part A. Therefore, in the course of the etching process, the insulating layer 110 of the part B is completely eliminated, but that of the DRAM cell forming part A remains partially intact.

Figure 12:
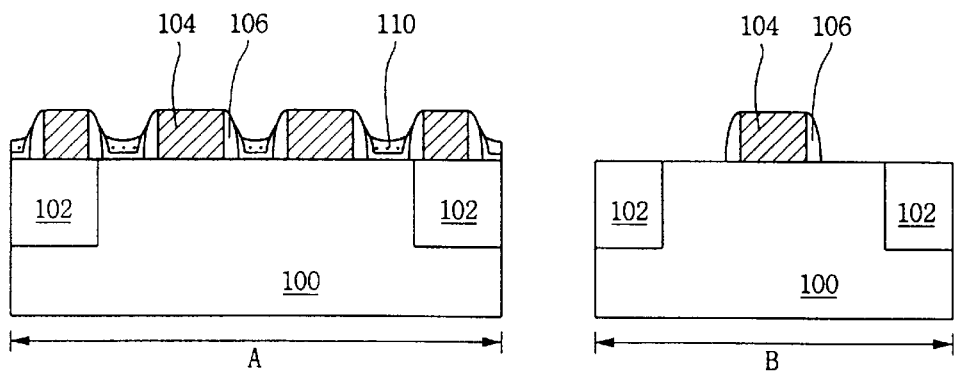

FIG. 12 illustrates dry etching the etch stopper layer 108 in the regions other than the regions where the insulating layer 110 remains to expose the silicide layer forming part (for instance, the surface of the gate electrode 104 of the DRAM cell forming part A and the surface of the gate electrode and the active area of the logic forming part B).

Figure 13:
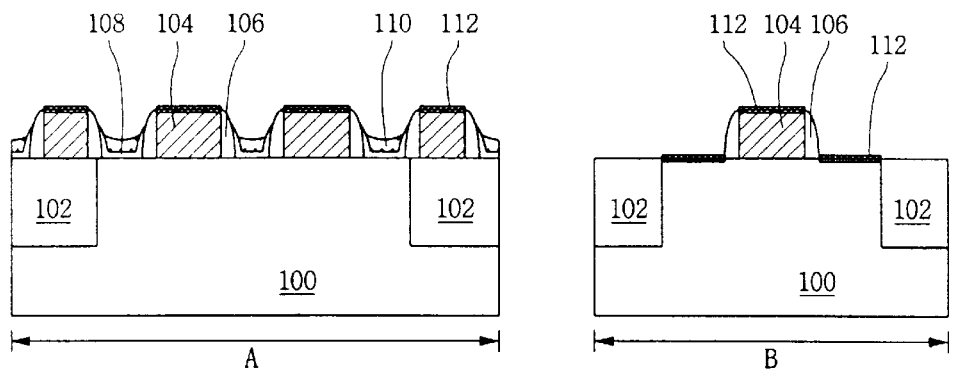

In FIG. 13, a metal having a high melting point (i.e., a refractory metal), such as Co, Ti, or Ni is deposited over the resultant structure from FIG. 12, and then a heat treatment cycle is carried out thereon. During the heat treatment cycle, silicon present in the exposed silicide layer and a metal of a high melting point (refractory) react together at the portion where the insulating layer 110 was eliminated to thereby form a low resistance metal silicide layer 112 (for example, CoSi, TiSi, and NiSi). On the other hand, at the region where the etch stopper layer 108 and the insulating layer 110 remain, and at the region where the spacers 106 were formed, silicon and a metal of a high melting point (refractory) can not react together, thereby leaving the metal having a high melting point to be a non-reacted metal. This deposited metal then can be eliminated with, for example, sulfuric acid to thereby complete the process.

The resulting semiconductor device shown in FIG. 13, has gate electrodes 104 formed on the substrate 100 of the semiconductor device, and spacers 106 formed of an insulating layer that is disposed at both walls of the gate electrode 104. Active areas for a source and a drain preferably are formed inside the substrate 100 at both edges of the gate electrode 104. The SBL (remaining portions of insulating layer 110), which is disposed lower than the gate electrode 104 is formed at the active areas of the gate electrode of the DRAM cell forming part A. The silicide layer 112 is formed on the gate electrode 104 of the DRAM cell forming part A and on the gate electrode 104 and the active area of the other predetermined region (for example, the logic forming part B). As a result, a semiconductor device having the structure shown in FIG. 13 is constructed.

As shown in FIG. 13, the SBL preferably is constructed to have a deposition layer structure including etch stopper layer 108 and insulating layer 110. A nitride layer or an undoped polysilicon layer preferably is used for the etch stopper layer 108, and a single layer structure of USG or a CVD oxide layer, or a deposition layer structure comprising more than one of these layers preferably is used for the insulating layer 110.

By making the semiconductor device in the aforementioned manner, an ARL evaporation deposition process or a separate photo etching process typically employed in making conventional semiconductor devices is not needed when etching the insulating layer 110 used for the SBL. Therefore, the fabricating operations of the invention can be simplified when forming a selective silicide layer, and the number of masks can be reduced by at least 1 mask to effectively cut down production cost.

In order to prevent the silicide layer from being formed at the active areas (source and drain zone) of the logic forming part B (if desired), a photo etching process preferably can be performed to protect the etch stopper layer of the portion with a photoresistance layer before the dry etching process is performed on the etch stopper layer 108. As a result, the etch stopper layer 108 partially remains at the active area of the logic forming part B.

Furthermore, in order to form the silicide layer 112 in the active areas of the region where the bit line is contacted at the DRAM cell forming part A, a polysilicon etching process can be performed to the gate electrode 104 to make the active area of the region at the first step exposed more widely than the active area of the region where the storage node (not shown) is formed. The active area of the DRAM cell forming part is present where the bit line is to be formed when the gate electrode 104 initially is formed. The insulating layer 110 of this portion therefore can be eliminated in this etching process.

In order to make the method of the present invention better understood, detailed descriptions regarding formation of the silicide layer 112 at periphery parts or input/output ends have been omitted. Skilled artisans recognize, however, that the selective silicide layer 112 can be formed even at those portions using the same fabricating method as described above.

On the other hand, in accordance with the aforementioned embodiment of the present invention, there may be a modified method of fabricating the silicide layer 112 in the semiconductor device. In this modified method, the insulating layer 110 to be used for the SBL can be formed over the substrate 100 including gate electrode 104 and spacers 106 without a process of accumulating an etch stopper layer 108. Then, the insulating layer 110 can be wet etched (or wet etched after dry etched). In this method, the insulating layer 110 will remain in self alignment at the active areas (source and drain zone) disposed between gate electrodes 104 of the memory cell forming part A. In this case, the SBL is made of a single layer structure of the insulating layer 110, and not a deposition layer structure of etch stopper layer 108 and insulating layer 110. As a result, a separate etching process to eliminate the etch stopper layer 108 is not needed to manufacture the device, thereby simplifying the method.

Referring now to the method shown in FIGS. 14 through 19, a method of fabricating a selective silicide layer will be described in accordance with another embodiment of the present invention. In this embodiment, a silicide layer can be formed at the gate electrode and at the active area of the logic forming part and at the gate electrode of the DRAM cell forming part, but will not be formed at the active area (particularly, storage node forming portion) of the DRAM cell forming part. Symbols A and B in the drawings represent a DRAM cell forming part and a logic forming part, respectively, of the semiconductor device.

Figure 14:
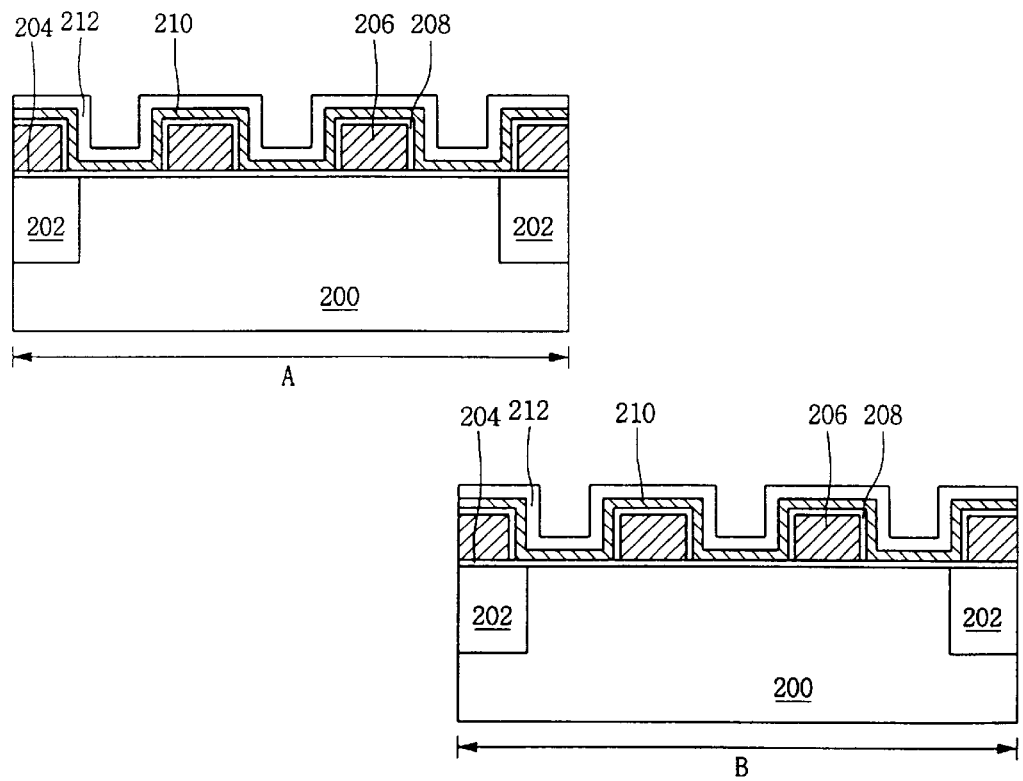
FIGS. 14 through 19 illustrate a process sequence for fabricating a selective silicide layer of a semiconductor device in accordance with another embodiment of the present invention.

As shown in FIG. 14, a shallow trench isolation (STI) 202 is formed by applying a trench technique at a predetermined portion inside a semiconductor substrate 200 (for instance, silicon substrate). A gate insulating layer 204 then preferably is formed over the entire substrate 200 including STI 202 by using, for example, an oxidation process, and, then a polysilicon gate electrode 206 can be formed thereon. Skilled artisans recognize that STI 202 which is used for a device separation zone, can be replaced with a field oxide layer as shown in FIG. 1 (field oxide layer 12). Then, the gate electrode 206 is used as a mask to ion implant a low concentration of impurities into substrate 200 to form a lightly doped drain LDD (not shown).

An insulating layer 208, preferably made of an oxide layer such as high temperature oxide (HTO), a medium temperature oxide (MTO) or a plasma enhanced oxide (PEOX) then can be formed over the substrate 200 to surround the gate electrode 206, on which a nitride layer 210 and an oxide layer 212 are sequentially deposited. The nitride layer 210 preferably is made of a SiN or a SiON layer, and the oxide layer 212 preferably is made of a CVD oxide layer having a greater etching ratio in comparison with the nitride layer 210. Representative examples of useful oxide layers can include tetra ethyl orthosilicate oxide (TEOS oxide), PEOX, USG, and the like. The desired thickness of the nitride layer 210 preferably is from 100 to 400 Å, and the desired deposition thickness ratio of the nitride layer 210 and the oxide layer 212 is 1:1–1:10. Skilled artisans are capable of depositing a suitable nitride layer 210 and an oxide layer 212 at the appropriate thickness and etching ratio, using the guidelines provided herein.

Figure 15:
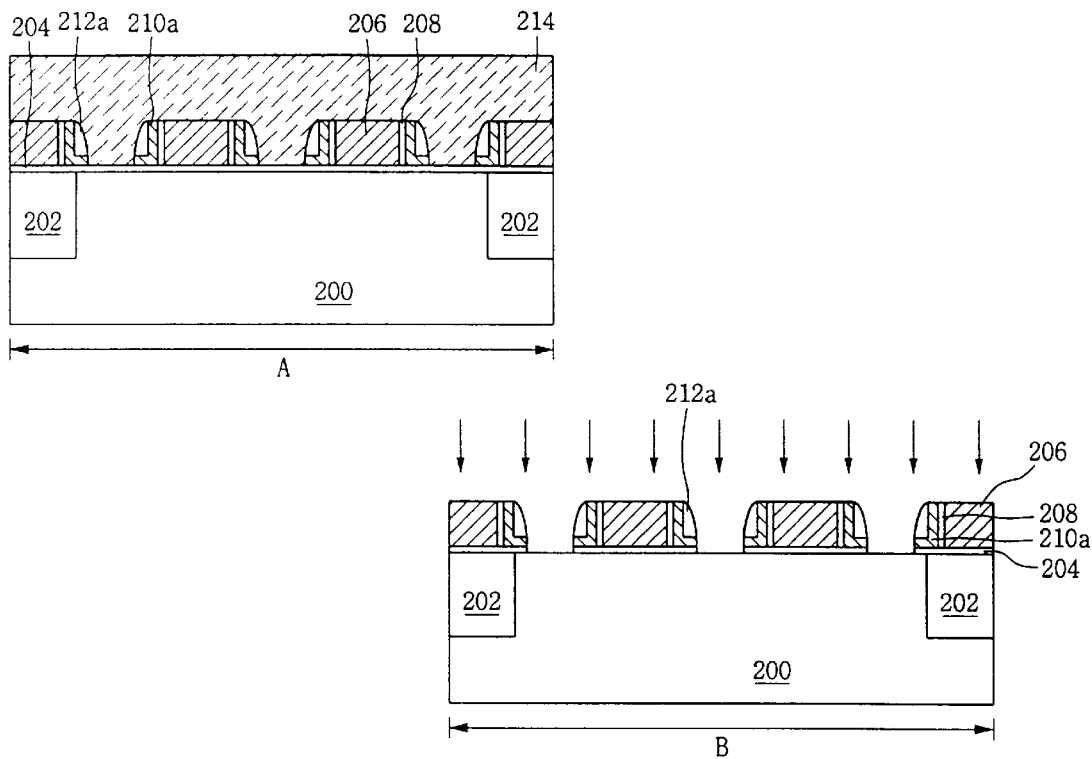

FIG. 15 illustrates an etchback process that can be performed on the oxide layer 212 to expose the surface of the gate electrode 206, thereby forming spacers at both lateral walls of the gate electrode 206. In this process, the nitride layer 210 can partially be etched together with the oxide layer 212. Using this method, spacers can be made having a dual layer structure including a nitride layer 210a disposed adjacent to the lateral walls of the gate electrode 206 and an oxide layer 212a disposed on nitride layer 210a and external to gate electrode 206. A portion of insulating layer 208 also can remain interposed between nitride layer 210a and gate electrode 206. Then, a photo etching process preferably is used for selectively forming a photoresist layer pattern 214 only at the DRAM cell forming part A. The gate electrode 206 and spacers then can be used as a mask to ion implant a high concentration of impurities into the substrate 200, thereby forming active areas for a source and a drain zone inside the substrate 200 at both edges of the gate electrode 206.

Figure 16:
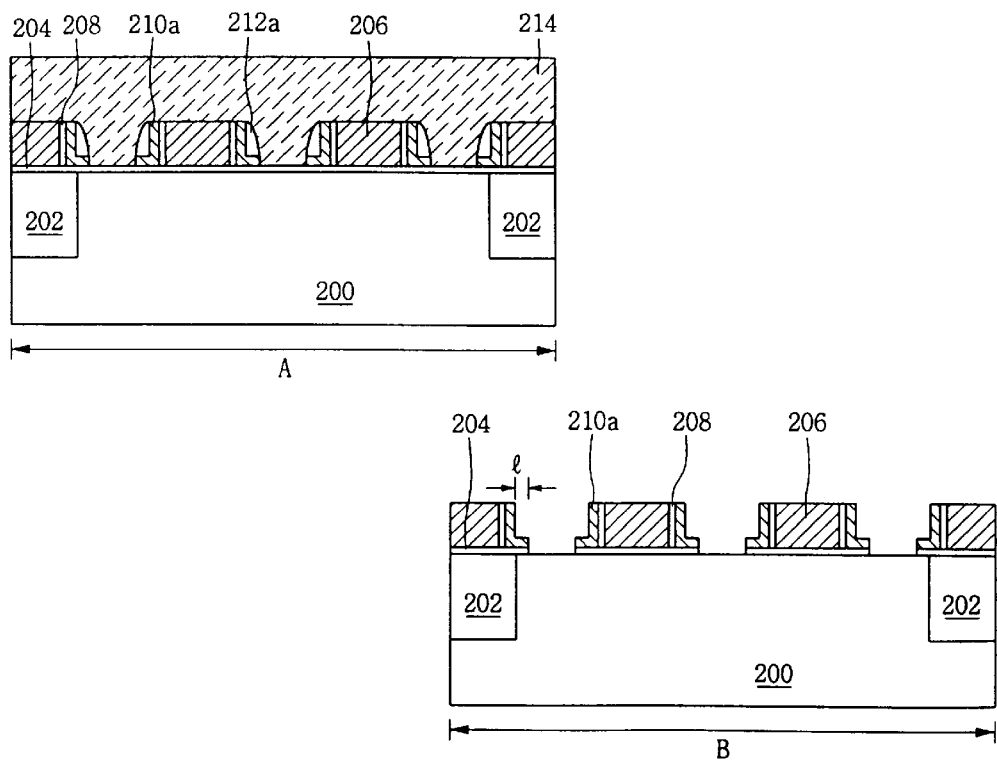

In FIG. 16, the oxide layer 212a forming a spacer at the region where the photoresist pattern 214 is not formed, preferably is eliminated to thereby form a spacer comprised of a single nitride layer structure 210a at a predetermined region (for instance, the logic forming part B as shown in FIG. 16) but not in the DRAM cell forming part A. The oxide layer 212a forming the spacer preferably is eliminated by a wet etching method whereby the portion exposed on the surface of the gate insulating layer 204 formed at the logic forming part B is eliminated as well.

As described above, spacers preferably are made of a dual layer structure (oxide layer 212a and nitride layer 210a), and the oxide layer 212a forming spacers at a predetermined region (for instance, a logic forming part B) is eliminated by a wet etching process. This fabricating method is used because, even if the spacer made of a nitride layer 210a still covers the active area of the region where the oxide layer 212a is eliminated, (e.g., at the logic forming part B), the thickness of the nitride layer 210a is negligibly thin in comparison with that of the gate electrode 206. Therefore, without a separate photo etching process, the fabricating method of this embodiment accomplishes the same effect because the lateral dimension (as designated by "l" in FIG. 16) of the oxide layer 212a is extended by eliminating the active area of the logic forming part B.

Figure 17:
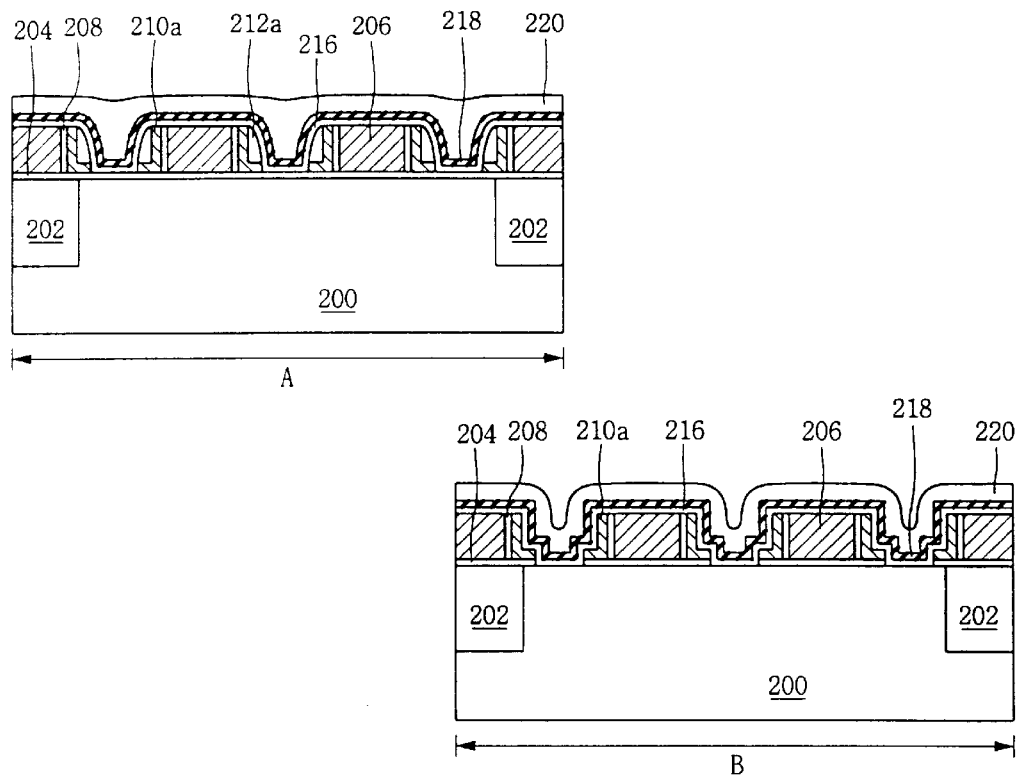

As shown in FIG. 17, the photoresist layer pattern 214 from FIG. 16 can be eliminated, and an insulating layer 216 to be used for the SBL and a thermal oxide layer 218 are sequentially deposited on the resultant structure. An insulating layer 220, preferably made of a CVD oxide layer is formed thereon. The insulating layer 216 which preferably is used for the SBL, preferably is made of SiN or SiON layer having a thickness of from 50 to 200 Å, and the thermal oxide layer 218 to be used for the SBL preferably is made of a HTO or a MTO layer. It is preferred in the invention that the insulating layer 220, which can be made of the CVD oxide layer, may be formed to have a thickness of from 100 to 3000 Å to take an advantage of the layer deposition characteristic in which the thickness of layers varies along with the distance disposed between gate electrodes 206. The CVD oxide layer 220 used at this time can be USG, borophospho silicate glass (BPSG), tetraethyl orthosilane (TEOS), and the like.

Figure 18:
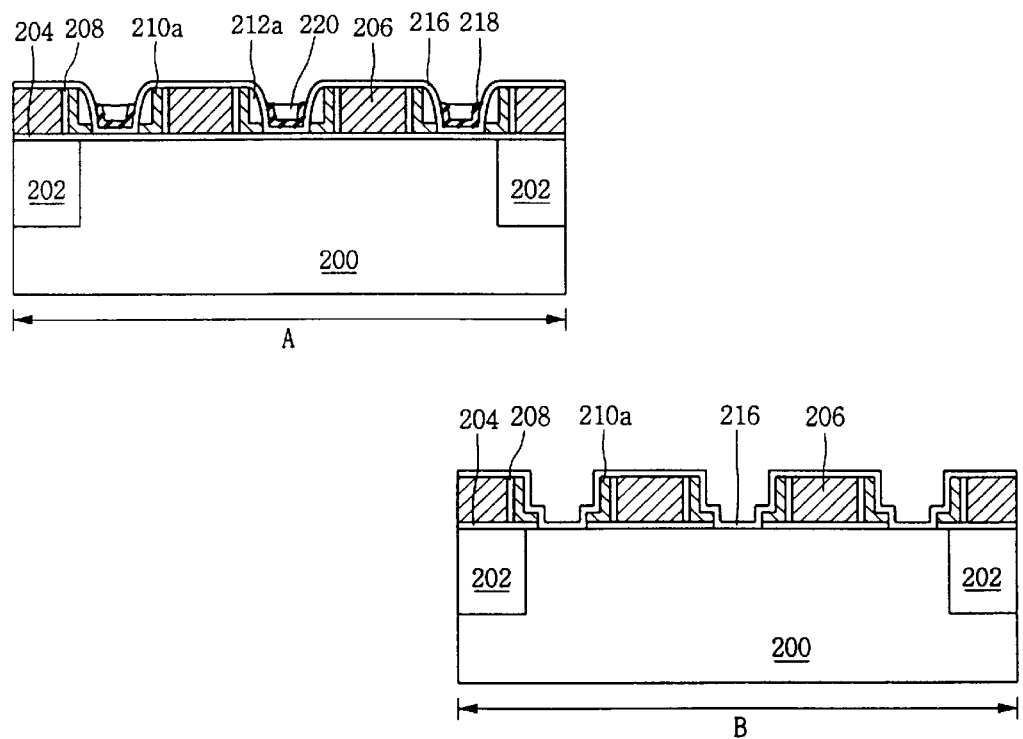

FIG. 18 illustrates performing an etchback process on the insulating layer 220, which preferably is made of a CVD oxide layer, until the surface of the insulating layer 216, which is to be used for the SBL of the gate electrode 206, is exposed. As a result, portions of the insulating layer 220 remain in self alignment at a thickness of, for example, hundreds of Angstroms, only at the active area disposed between gate electrodes 206 of the DRAM cell forming part A.

The reason that the insulating layer 220 is selectively etched and remains only at the DRAM cell forming part A can be described as follows. Even if spacers in the DRAM cell forming part A are made of a dual structure of a nitride layer 210a and a oxide layer 212a, spacers in the logic forming part B are made of a single structure of nitride layer 210a. Therefore, the active area of the logic forming part B is extended by "l," (FIG. 16), longer than the active area of the DRAM cell forming part A.

Figure 19:
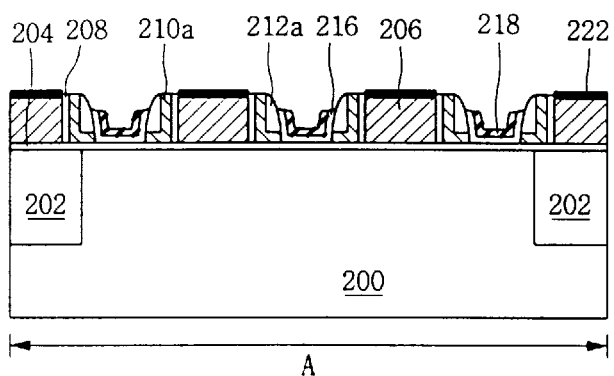
Figure 19:
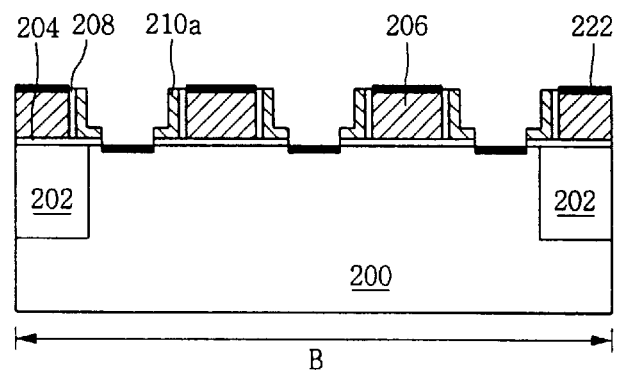

As shown in FIG. 19, insulating layer 216, which is used as the SBL is etched, except in the regions where the insulating layer 220 remains, to expose the silicide layer forming part (for instance, at the surface of the gate electrode 206 of the DRAM cell forming part A and the surfaces of the gate electrode and the active areas of the logic forming part B). A metal having a high melting point, (i.e., a refractory metal) such as Co, Ti, or Ni preferably is deposited over the resultant structure, and then a heat treatment cycle is carried out thereon. During the heat treatment cycle, silicon present in the exposed silicide layer and the metal having a high melting point (e.g., refractory metal) react together at the portions where the insulating layer 216 was eliminated to thereby form a low resistance metal silicide layer 222 (for instance, CoSi, TiSi, NiSi). On the other hand, at the region where the insulating layer 216 and the thermal oxide layer 218 to be used for the SBL remain, and at the region where the spacers were formed, silicon and the metal having a high melting point can not react together, thereby leaving the metal of a high melting point to be a non-reacted metal. This deposited non-reacted metal then can be eliminated with, for example, sulfuric acid to thereby complete the process.

The semiconductor shown in FIG. 19 has gate electrodes 206 formed on the substrate 200 of the semiconductor device. Spacers are formed having a dual structure including a nitride layer 210a and an oxide layer 212a on both walls of the gate electrode 206 in the DRAM cell forming part, and in a single structure of a nitride layer 210a on the other predetermined regions (for instance, in the logic forming part). An active area for a source and a drain is formed inside the substrate 200 at both edges of the gate electrode 206. The SBL (remaining parts of insulating layer 216 and thermal oxide layer 218), in the shape of a thin layer, is formed at the active area between the gate electrodes 206 of the DRAM cell forming part A, and a silicide layer 222 is formed at the gate electrode 206 of the DRAM cell forming part A and at the gate electrode 206 and the active area of the other predetermined regions (for instance, the logic forming part B). As a result, a semiconductor device having the structure shown in FIG. 19 is constructed.

As shown in FIG. 19, the SBL preferably is constructed having a deposition layer structure including insulating layer 216 and thermal oxide layer 218. A nitride layer 216 preferably is made of SiN or SiON, and the thermal oxide layer 218 preferably is made of HTO or MTO. Furthermore, the spacer 210a made of a nitride layer, is positioned closer to the gate electrode 206 than oxide layer 218 formed at the DRAM cell forming part A, and the spacer 210a in a single structure formed at the logic forming part B are all made into the shape of an L.

By making the semiconductor device in the aforementioned manner, an ARL evaporation deposition process or a separate photo etching process typically employed when making conventional semiconductor devices, is not needed when etching the insulating layer 216 be used for the SBL. Therefore, the fabricating operations of the invention can be simplified when forming a selective silicide layer, which reduces production cost. Furthermore, process defects caused by misalignment and process defects caused by eliminating the ARL can be prevented.

In this embodiment, even if the active area of the DRAM cell forming part A and the active area of the logic forming part B are formed to have the same size in accordance with high integration of a semiconductor device, the oxide layer externally positioned out of the dual structure of spacers 212a may be eliminated to thereby simply increase the active area of the silicide layer forming part by the distance l (FIG. 16). Therefore, there is an advantage in this embodiment of the present invention in that the fabricating method can be used for forming a selective silicide layer, regardless of the size of the active areas of the DRAM cell forming part A and the logic forming part B.

A following operation (for instance, a contact wiring process) can be performed after eliminating the oxide layer 212a positioned at the external portion of the spacers disposed at a predetermined region (for instance, the logic forming part B) other than the DRAM cell forming part A. Therefore, even if misalignment occurs in the course of formation of a contact hole, the thickness of the nitride layer 210a formed at the active area, is very thin to prevent the nitride layer 210a from functioning as an etch stop when etching the insulating layer to form the contact hole. Accordingly, the present invention can prevent the size of the bottom of the contact hole from decreasing to thereby increase the margin to misalignment, securing stable operations of the semiconductor device.

As described above, there are advantages in the present invention in that, firstly, an insulating layer which can be used for a SBL is selectively etched without an ARL deposition process or a photo etching process. This reduces the number of the photo etching processes by one cycle in the formation of the selective silicide layer of a semiconductor device (for instance, DRAM or embedded DRAM) to thereby simplify the fabricating process and reduce production cost. Secondly, process defects caused by misalignment (the silicide layer is not locally formed on the gate electrodes or the silicide layer is only locally formed at the source and drain zone for the active areas) and process defects caused by eliminating the ARL (etching the insulating layer used for the SBL is therefore required) are simultaneously removed to thereby improve process reliability. Finally, the margin to misalignment is increased thereby securing stable operation of the semiconductor device.

While the invention has been described in terms of preferred embodiments, those skilled in the art will recognize that various modifications may be made to the invention without departing from the spirit and scope thereof.

What is claimed is:

1. A method of making a semiconductor device comprising:

providing a substrate having a DRAM cell forming part and a logic forming part;

forming at least one gate electrode having lateral walls and edges on the substrate;

forming spacers on the lateral walls of the gate electrode;

forming active areas in the substrate at the edges of the gate electrode in both the DRAM cell forming part and in the logic forming part;

forming an insulating layer on the entire surface of the substrate including the gate electrode and the spacers;

etching the insulating layer by more than the thickness of the insulating layer that is disposed above the at least one gate electrode so that portions of the insulating layer remain in self-alignment at active areas disposed between gate electrodes of the DRAM forming part; and forming a silicide layer on the gate electrode of the DRAM cell forming part, and on the gate electrode and the active area of the logic forming part.

2. The method as claimed in claim 1, wherein the insulating layer is made of a material selected from a single layer structure comprising USG or a CVD oxide layer, or a deposition layer structure.

3. The method as claimed in claim 1, wherein etching the insulating layer comprises wet etching.

4. The method as claimed in claim 1, wherein etching the insulating layer comprises dry etching and then wet etching.

5. The method as claimed in claim 1, wherein the silicide layer comprises a material selected from the group consisting of CoSi, TiSi, and NiSi.

6. The method as claimed in claim 1, wherein forming the gate electrode exposes an active area of a portion of the substrate where a bit line is formed on the DRAM cell forming part more widely than an active area of a portion of the substrate where a storage node is formed, and the silicide layer is formed at the active area of the portion of the substrate where the bit line is formed.

7. A method of making a semiconductor device comprising:

providing a substrate having a DRAM cell forming part and a logic forming part;

forming at least one gate electrode having lateral walls and edges on the substrate;

forming spacers on the lateral walls of the gate electrode;

forming at least one active area inside the substrate at the edges of the at least one gate electrode;

forming an etch stopper layer over the entire surface of the substrate including the gate electrode and the spacers;

forming an insulating layer on the etch stopper layer;

etching the insulating layer until the etch stopper layer of the gate electrode is exposed so that portions of the insulating layer remain in self-alignment at an active area disposed between gate electrodes of the DRAM cell forming part;

eliminating the etch stopper layer disposed at the portions where the insulating layer was removed to thereby expose the gate electrode of the DRAM cell forming part and the gate electrode and the active area of the logic forming part; and forming a silicide layer on the gate electrode of the DRAM cell forming part and on the gate electrode and the active area of the logic forming part.

8. The method as claimed in claim 7, wherein the insulating layer is made of a material selected from a single structure comprising USG or a CVD oxide layer, or a deposition layer structure.

9. The method as claimed in claim 7, wherein etching the insulating layer comprises wet etching.

10. The method as claimed in claim 7, wherein the etch stopper layer comprises a layer selected from a nitride layer or an undoped polysilicon layer, and the etch stopper layer has a thickness of from 20 to 200 Å.

11. The method as claimed in claim 7, wherein etching the etch stopper layer comprises dry etching.

12. The method as claimed in claim 7, wherein the silicide layer comprises a material selected from the group consisting of CoSi, TiSi, and NiSi.

13. The method as claimed in claim 7, wherein forming the gate electrode exposes an active area of a portion of the substrate where a bit line is formed on the DRAM cell forming part more widely than an active area of a portion of the substrate where a storage node is formed, and the silicide layer is formed at the active area of the portion of the substrate where the bit line is formed.

14. A method of making a semiconductor device comprising:

providing a substrate having a DRAM cell forming part and a logic forming part;

forming at least one gate electrode on the substrate, the gate electrode having lateral walls and edges;

forming spacers at the lateral walls of the gate electrode, the spacers comprising a dual layer construction having a first layer disposed adjacent the lateral walls of the gate electrode, and a second layer disposed on the first layer and external to the lateral walls;

forming a photoresist layer pattern at the DRAM cell forming part and ion implanting a high concentration of impurities into the resultant structure to form an active area;

etching the spacers using the photoresist layer pattern as a mask to eliminate the second layer disposed external to the lateral walls of the gate electrode to produce a single layer structure of the spacers in the logic forming part;

removing the photoresist layer pattern;

forming a silicide blocking layer on the resultant structure;

forming an insulating layer on the silicide blocking layer;

etching the silicide blocking layer until the silicide blocking layer disposed on the gate electrode is exposed so that portions of the insulating layer remain in self-alignment at the active area disposed between the gate electrodes of the DRAM cell forming part;

etching the silicide blocking layer of the region where portions of the insulating layer do not remain to expose the gate electrode of the DRAM cell forming part and the gate electrode and active area of the logic forming part; and forming silicide layers on the gate electrode of the DRAM cell forming part, and on the gate electrode and the active area of the logic forming part.

15. The method as claimed in claim 14, wherein forming the spacers having a dual layer construction comprises:

sequentially depositing a nitride layer and an oxide layer over the resultant structure after formation of the gate electrode; and performing an etch-back process of the oxide layer and the nitride layer until the surface of the gate electrode is exposed.

16. The method as claimed in claim 15, wherein the nitride layer is made of a material selected from SiN or SiON, and the nitride layer has a thickness of from 100 to 400 Å.

17. The method as claimed in claim 15, wherein the oxide layer is made of a material selected from the group consisting of TEOX, PEOX, and USG.

18. The method as claimed in claim 15, wherein the nitride layer and oxide layer are deposited at a thickness ratio of 1:1–1:10.

19. The method as claimed in claim 14, wherein the silicide blocking layer comprises a deposition layer structure comprising an insulating layer and a thermal oxide layer.

20. The method as claimed in claim 19, wherein the insulating layer comprises a material selected from SiN or SiON, and the insulating layer has a thickness of from 50 to 200 Å.

21. The method as claimed in claim 19, wherein the thermal oxide layer comprises a material selected from a high temperature oxide layer and a medium temperature oxide layer.

22. The method as claimed in claim 14, wherein the insulating layer comprises a CVD oxide layer having a thickness of from 1000 to 3000 Å.

23. The method as claimed in claim 22, wherein the CVD oxide layer comprises a material selected from the group consisting of USG, borophosphate silicate glass (BPSG), tetraethyl orthosilane (TEOS), and mixtures thereof.

24. The method as claimed in claim 14, wherein the silicide layer is formed of a metal having a high melting point selected from the group consisting of CoSi, TiSi, and NiSi.

* * * * *